United States Patent [19]

Goettling et al.

[11] Patent Number: 5,561,367
[45] Date of Patent: Oct. 1, 1996

[54] STRUCTURE AND METHOD FOR TESTING WIRING SEGMENTS IN AN INTEGRATED CIRCUIT DEVICE

[75] Inventors: F. Erich Goettling; Roger D. Carpenter, both of Cupertino; Vincent L. Tong, Fremont, all of Calif.

[73] Assignee: Xilinx, Inc., San Jose, Calif.

[21] Appl. No.: 920,339

[22] Filed: Jul. 23, 1992

[51] Int. Cl.$^6$ ........................................ G01R 31/02
[52] U.S. Cl. .................... 324/158.1; 324/763; 324/765
[58] Field of Search ............................ 324/158 R, 73.1, 324/537, 500, 158 P, 72.5, 158.1, 763, 765; 371/15.1, 28, 22.1, 22.2, 22.3, 22.6; 437/8; 357/41; 257/48, 40

[56] References Cited

U.S. PATENT DOCUMENTS

| | | | |
|---|---|---|---|
| Re. 34,363 | 8/1993 | Freeman | 307/465 |
| 3,983,479 | 9/1976 | Lee et al. | 324/537 |
| 3,995,215 | 11/1976 | Chu et al. | 324/158 R |
| 4,144,493 | 3/1979 | Lee et al. | 324/158 R |
| 4,281,449 | 8/1981 | Ports et al. | 324/537 |
| 4,714,875 | 12/1987 | Bailey et al. | 324/158 F |
| 4,725,773 | 2/1988 | Lieneweg | 324/73.1 |
| 4,758,745 | 7/1988 | Elgamal et al. | 307/465 |
| 4,786,904 | 11/1988 | Graham, III et al. | 340/825.83 |
| 4,801,869 | 1/1989 | Sprogis | 324/158 R |
| 4,873,459 | 10/1989 | El Gamal et al. | 340/825.84 |
| 4,894,605 | 1/1990 | Ringleb et al. | 324/537 |
| 4,918,377 | 4/1990 | Buehler et al. | 324/158 R |
| 5,059,897 | 10/1991 | Aton et al. | 324/158 R |
| 5,083,083 | 1/1992 | El Ayat et al. | 371/22.2 |
| 5,208,530 | 5/1993 | El-Ayat et al. | 324/158 T |

OTHER PUBLICATIONS

El Gamal, Abbas; Greene, Jonathan; Reyneri, Justin; Rogoyski, Eric; El-Ayat, Khaled A. and Mohsen, Amr; "An Architecture for Electrically Configurable Gate Arrays", IEEE Journal of Solid–State Circuits, vol. 24, No. 2, Apr. 1989, pp. 394–398.

Primary Examiner—Vinh P. Nguyen
Attorney, Agent, or Firm—Edel M. Young

[57] ABSTRACT

According to the present invention, means are provided for joining metal wire segments into one or more serpentine structures during the testing phase so that a signal applied at one end will be detected at the other end if the metal segments are continuous. Metal segments connected into one serpentine chain can be simultaneously tested for continuity from a single origin and destination. Preferably two serpentine chains are provided, physically interdigitated with each other so that electrical shorts between adjacent wire segments will cause a signal applied to one serpentine chain to be detected on the other serpentine chain.

10 Claims, 3 Drawing Sheets

STRUCTURE AND METHOD FOR TESTING WIRING SEGMENTS IN AN INTEGRATED CIRCUIT DEVICE

FIELD OF THE INVENTION

The invention relates to integrated circuit devices and to a method for testing the devices during manufacturing. More particularly the invention relates to testing of wiring segments in a programmable integrated circuit device.

BACKGROUND OF THE INVENTION

When an integrated circuit device is being manufactured, it is necessary to test components of the device, preferably all components, for proper operation. For example all transistors must be tested. All antifuses must be tested for non-conductivity in their original state (antifuses can not be tested in their programmed state because the programming is one-time-only and must be left to the user). All metal lines must also be tested, both for continuity throughout their length and for shorts to adjacent metal lines. A simple means for applying test vectors to the metal lines is preferred in order to facilitate testing.

SUMMARY OF THE INVENTION

According to the present invention, means are provided for joining metal wire segments into one or more serpentine structures during the testing phase so that a signal applied at one end will be detected at the other end if the metal segments are continuous. Metal segments connected into one serpentine chain can be simultaneously tested for continuity from a single origin and destination. Preferably two serpentine chains are provided, physically interdigitated with each other so that electrical shorts between adjacent wire segments will cause a signal applied to one serpentine chain to be detected on the other serpentine chain.

DETAILED DESCRIPTION OF THE INVENTION

Figure 1:
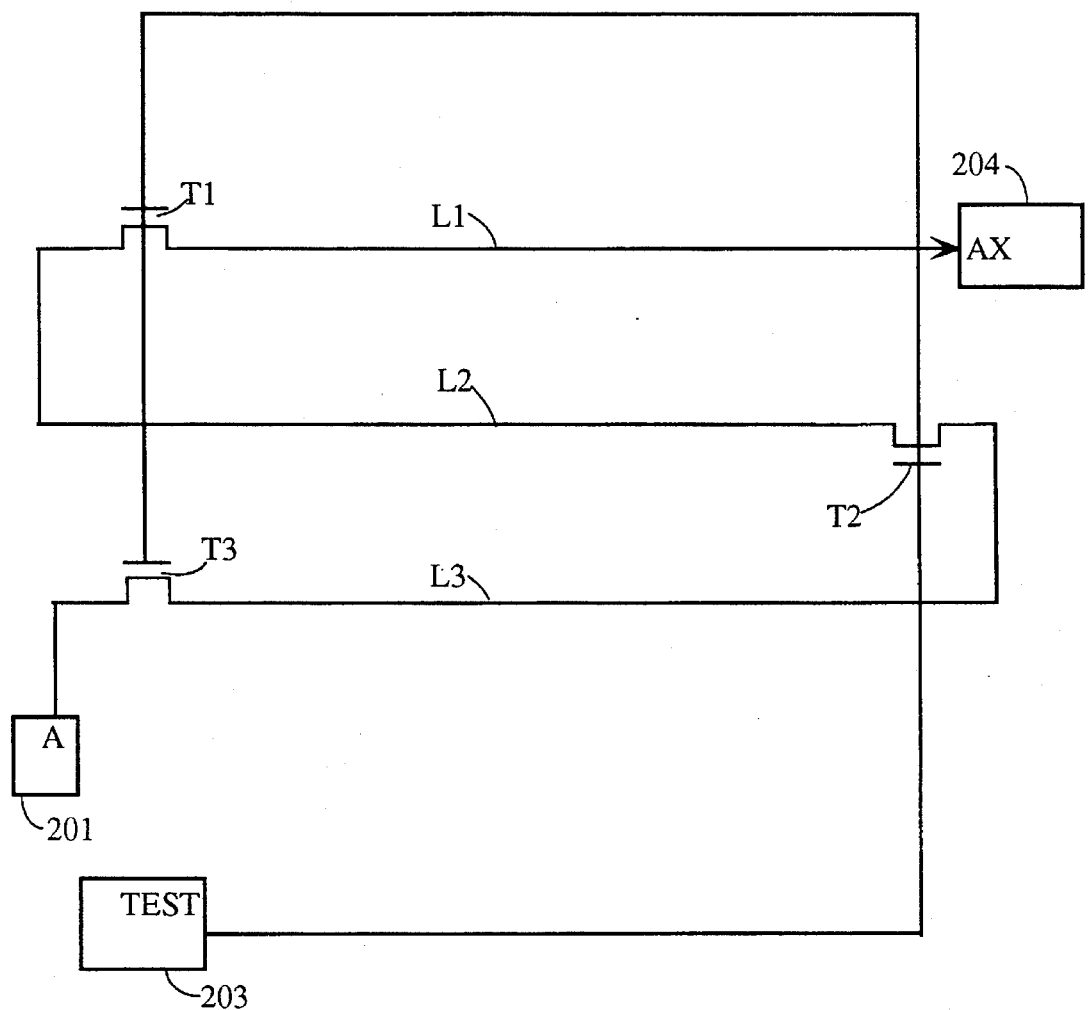
FIG. 1 shows a first embodiment of the invention.

FIG. 1 shows a plurality of wiring segments L1, L2, and L3, representative of wiring segments in a programmable logic device. During operation of the device, these wiring segments are available for connecting other structures not shown in FIG. 1 to each other or to other wiring segments. According to the invention, transistors such as T1, T2, and T3 are formed so that when turned on they join the wiring segments into a continuous chain. A test signal TEST is applied by means 203 to the gates of transistors T1, T2, and T3 causing the transistors to turn on for interconnecting the wiring segments L1, L2, and L3. A signal applied at A by means 201 will be detected at AX by means 204 if the wiring segments have been properly formed so that no defects break the continuity. During operation of the device, transistors T1, T2, and T3 which interconnect the wiring segments are turned off by test means 203, so that the wiring segments may be used separately for interconnecting parts of the device as desired. Testing transistors T1, T2, and T3 can be very small transistors, since they need carry only a small current for continuity testing.

Figure 2:
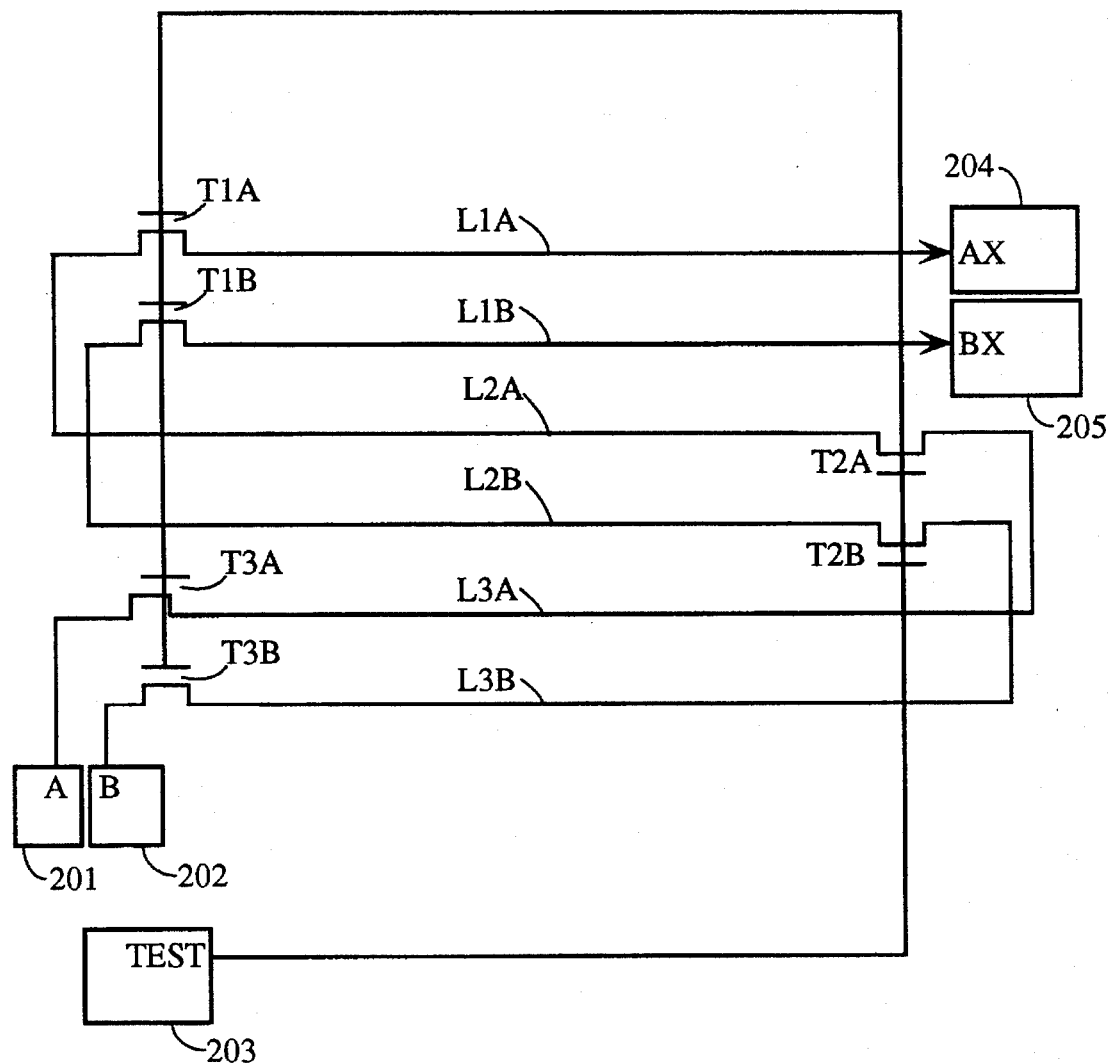
FIG. 2 shows a second embodiment of the invention.

In a preferred embodiment, there are two serpentine structures connected as shown in FIG. 2. Physically adjacent metal lines are connected alternately into two different serpentine chains A and B. By electrically isolating alternate metal lines into two different chains, the structure can be tested both for shorts between adjacent metal lines and for continuity of each metal line. A signal applied at A by means 201 will be detected at B or BX by means 202 or 205, if there is a short between adjacent metal lines. The single or double serpentine interconnection method may be used for testing any kind of architecture in which multiple conductive lines must be tested.

A single control signal, labeled in FIG. 2 as TEST turns on all transistors simultaneously for testing metal continuity.

Figure 3:
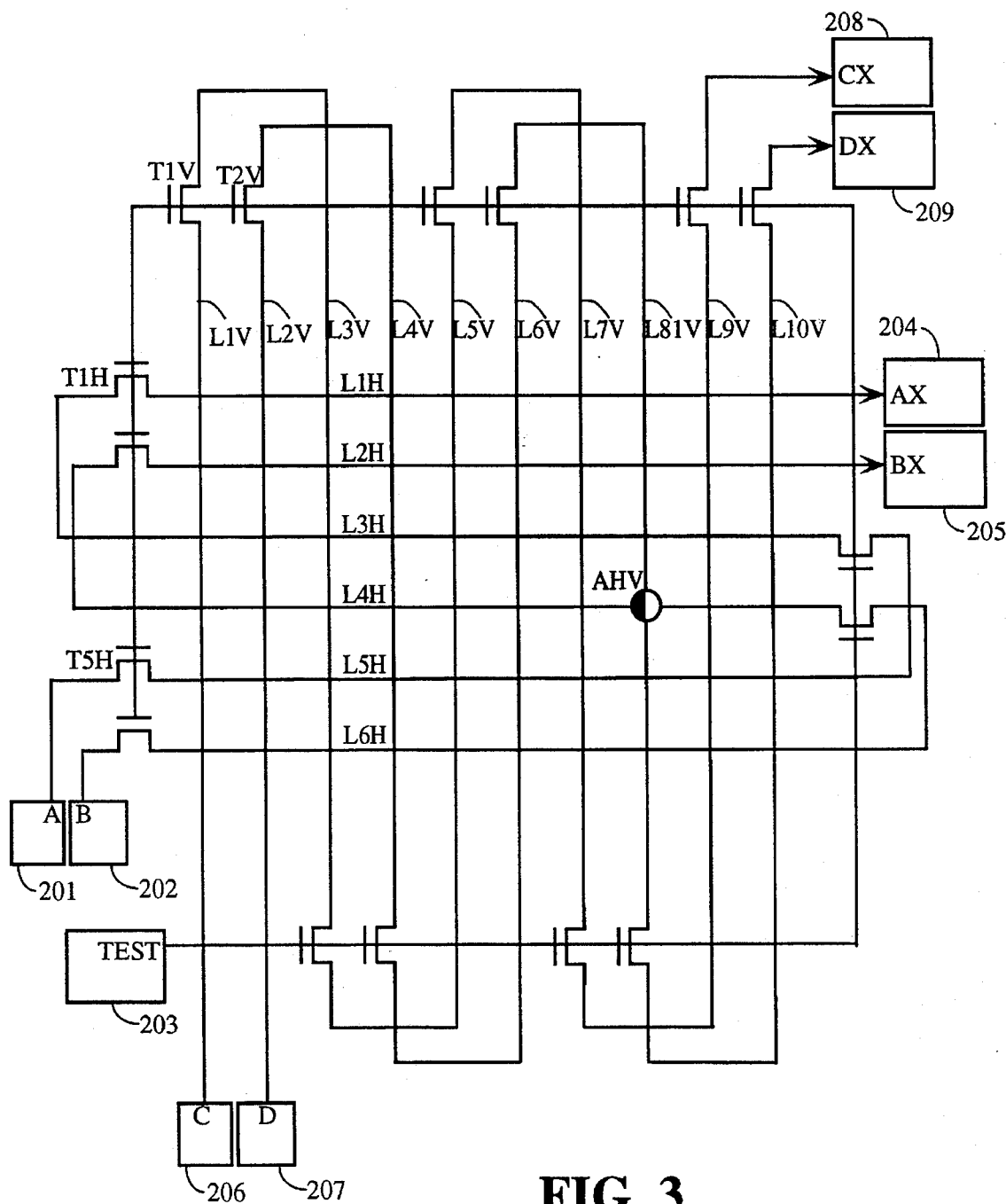
FIG. 3 shows a third embodiment of the invention.

FIG. 3 shows a third embodiment of the invention. Both horizontal and vertical lines are shown. Separate pairs of serpentine chains are used for testing horizontal and vertical lines. With this arrangement, shorts which may occur at crossovers between horizontal and vertical lines can be detected. The label H refers to horizontal lines or to transistors or antifuses which interconnect horizontal lines. Likewise, the label V refers to vertical lines or to transistors or antifuses which interconnect vertical lines. For simplicity, not all labels have been shown.

Antifuses are used in some programmable devices for interconnecting horizontal and vertical lines. One such antifuse AHV is illustrated in FIG. 3. In an actual device using antifuse interconnect, there would be such antifuses at many of the intersections. Such antifuses are typically formed between conductive lines in adjacent conductive layers of the device. For example, horizontal conductive lines may be formed primarily in first metal and vertical conductive lines may be formed primarily in second metal. Antifuses formed at the intersections in a layer or layers between first and second metal may be programmed by applying a sufficient voltage difference between lines which contact one antifuse. A structure such as shown in FIG. 3 is particularly useful for testing a device which includes antifuses between horizontal and vertical lines. If antifuse AHV fails to be nonconductive when manufactured, this failure can be detected by applying a particular test signal, for example 5 volts, to node A and detecting this voltage at node DX by means 205. If antifuse AHV were properly formed, no current flow between node A and node DX would be detected during testing. If there is a short between adjacent metal lines, a signal applied at A by means 201 will be detected at B,BX,C,CX, D, or DX by means of 202,205,206,207,208 or 209 respectively.

From the above description, many other embodiments will become obvious to those skilled in the art.

We claim:

1. A test structure for testing an integrated circuit device comprising:

a plurality of conductive wiring segments formed as part of said integrated circuit device for conducting signals between portions of said integrated circuit device during normal circuit operation;

switch means for controllably connecting said wiring segments into at least one serpentine chain;

means for applying a test signal to one end of said serpentine chain;

means for detecting said test signal at the other end of said serpentine chain.

2. A test structure as in claim 1 in which said at least one serpentine chain comprises two serpentine chains;

said means for applying a test signal to one end of said serpentine chain comprises means for applying a test signal to one end of each of said two serpentine chains; and said means for detecting said test signal at the other end of said serpentine chain comprises means for detecting a test signal at the other end of each of said two serpentine chains.

3. A test structure as in claim 2 in which:

said two serpentine chains comprise two horizontal serpentine chains formed primarily from horizontal wiring segments and two vertical serpentine chains formed primarily from vertical wiring segments;

said means for applying test signal to one end of each of said two serpentine chains comprises means for applying a test signal to one end of each horizontal serpentine chain and a test signal to one end of each vertical serpentine chain; and said means for detecting a test signal at the other end of each of said two serpentine chains comprises means for detecting a test signal at the other end of each horizontal serpentine chain and a test signal at the other end of each vertical serpentine chain.

4. A method for testing wiring segments formed as part of an integrated circuit device for conducting signals between portions of said integrated circuit device during normal circuit operation comprising the steps of:

controllably connecting said wiring segments into at least one serpentine chain through switch means;

applying a test signal to one end of said serpentine chain;

detecting said test signal at the other end of said serpentine chain.

5. A method for testing wiring segments as in claim 4 in which said step of connecting comprises connecting said wiring segments into two serpentine chains interdigitated with each other such that wiring segments forming one chain are physically close to wiring segments forming the other chain;

said step of applying a test signal to one end of said serpentine chain comprises applying a test signal to one end of each of said serpentine chains; and said step of detecting said test signal at the other end of said serpentine chain comprises detecting a test signal at the other end of each of said serpentine chains.

6. A test structure for testing an integrated circuit device comprising:

a plurality of conductive wiring segments formed as part of said integrated circuit device for conducting signals between portions of said integrated circuit device during normal circuit operation;

switch means for controllably connecting said wiring segments into at least two serpentine chains, a first serpentine chain and a second serpentine chain, wherein at least portions of said first serpentine chain are in close physical proximity to portions of said second serpentine chain;

means for applying a test signal to one end of said first serpentine chain;

means for detecting said test signal at one end of said second serpentine chain.

7. A test structure as in claim 6 in which said first serpentine chain is formed primarily in a first conductive layer, and said second serpentine chain is formed primarily in a second conductive layer.

8. A test structure as in claim 7 in which antifuses are formed between crossovers of at least some of said serpentine chains, whereby said means for detecting said test signal at one end of the other of said serpentine chains is able to detect shorts in said antifuses.

9. A test structure as in claim 6 in which said two serpentine chains are formed primarily in the same conductive layer.

10. A test structure for testing an integrated circuit device comprising:

a plurality of conductive wiring segments formed as part of said integrated circuit device for conducting signals between portions of said integrated circuit device during normal circuit operation;

switch means for controllably connecting said wiring segments into first and second serpentine chains, said segments of said first serpentine chain alternating with said segments of said second serpentine chain;

means for applying a test signal to one end of said first serpentine chain;

means for detecting said test signal at one end of said second serpentine chain.

* * * * *

UNITED STATES PATENT AND TRADEMARK OFFICE
CERTIFICATE OF CORRECTION

PATENT NO. : 5,561,367
DATED : October 1, 1996
INVENTOR(S) : F. Erich Goetting, et al.

It is certified that error appears in the above-identified patent and that said Letters Patent is hereby corrected as shown below:

On the title page:

Item [19] and Item [75], please correct the first inventor's last name to --Goetting--.

Col. 2, line 41, "205" should read --209--.

Signed and Sealed this

Thirtieth Day of December, 1997

Attest:

BRUCE LEHMAN

Attesting Officer

Commissioner of Patents and Trademarks